United States Patent
Chen

(10) Patent No.: US 9,525,431 B1
(45) Date of Patent: Dec. 20, 2016

(54) FEED FORWARD SIGMA-DELTA ADC MODULATOR

(71) Applicant: HYCON TECHNOLOGY CORP., Taipei (TW)

(72) Inventor: Hung-Wei Chen, Taipei (TW)

(73) Assignee: Hycon Technology Corp., Taipei (TW)

( * ) Notice: Subject to any disclaimer, the term of this patent is extended or adjusted under 35 U.S.C. 154(b) by 0 days.

(21) Appl. No.: 15/214,504

(22) Filed: Jul. 20, 2016

(51) Int. Cl.
*H03M 3/00* (2006.01)
*H03M 1/00* (2006.01)
*H03M 1/12* (2006.01)

(52) U.S. Cl.
CPC ............. *H03M 3/424* (2013.01); *H03M 3/464* (2013.01); *H03M 1/00* (2013.01); *H03M 1/12* (2013.01); *H03M 3/30* (2013.01)

(58) Field of Classification Search
CPC ............. H03M 3/30; H03M 1/00; H03M 1/12
USPC ............. 341/143, 155, 120, 110, 153
See application file for complete search history.

(56) References Cited

U.S. PATENT DOCUMENTS 9,438,268 B2 * 9/2016 Mitani ............. H03M 3/502

* cited by examiner

*Primary Examiner* — Joseph Lauture
(74) *Attorney, Agent, or Firm* — Che-Yang Chen; Law Offices of Scott Warmuth

(57) ABSTRACT

Disclosed is a feed forward sigma-delta analog to digital conversion (ADC) modulator. The disclosed structure combines feedback circuit, adder circuit and quantization circuit, and has advantages of high stability, without active circuit, and using successive approximation register (SAR) control circuit, thus realizes the function of multi-bit quantization by using only one comparator.

26 Claims, 9 Drawing Sheets

FEED FORWARD SIGMA-DELTA ADC MODULATOR

FIELD OF THE INVENTION

The present invention relates to a feed forward sigma-delta analog to digital conversion modulator. More particularly, the present invention relates to a sigma-delta analog to digital conversion (ADC) modulator with integrated feedback circuit, adder circuit and quantization circuit.

BACKGROUND OF THE INVENTION

Sigma-Delta Modulation (SDM) is widely used in various electronic components, e.g. an analog-to-digital converter, a switching capacitor filters a, frequency synthesizer and a wireless communication system. When applying to the analog-to-digital converter, since the SDM has a feature of noise shaping, if the higher order the SDM has, the better the effect of noise shaping is. It has an advantage of increasing signal-to-noise ratio for signals. Because an SDM of n order needs n integrators to implement, when an architecture of a SDM of 2 orders or higher is used, power consumption and circuit area will increase. In addition, the higher order the SDM has, the more unstable the circuit becomes.

In the Taiwan Patent No. 1350067, an architecture of a sigma-delta analog to digital conversion modulator is disclosed. In multi-integrators, a feed forward connecting method is applied to increase the stability of the system. However, it requires an adder, a gain amplifier and a quantizer to generate output signals. Complex circuit architecture increases circuit area and power consumption.

In Taiwan Patent No. 1437826, a sharing integrator is disclosed. When the sharing integrator uses a sigma-delta analog to digital conversion modulator of n order, only n/2 (when n is even) or (n+1)/2 (when n is odd) integrators are required. According to the operating method disclosed in the invention, each integrator processes integral operation twice to implement functions of the sigma-delta analog to digital conversion modulator of n order. Area and power consumption of the electronic system can be reduced. Defect in the invention is when it is applied to a sigma-delta analog to digital conversion modulator of 3 orders or higher, n/2 or (n+1)/2 integrators are serially connected. Directly serial connection of serial integrators would lead to instability of the circuit system. Meanwhile, the number of the integral operation will increase as the number of the integrators increases. Totally, it needs n or (n+1) integral operations. Operating speed of the system will drop. Take the sigma-delta analog to digital conversion modulator of 3 orders as an example. The architecture requires 2 integrators and 4 integral operations in total. Comparing to a sigma-delta analog to digital conversion modulator of 2 orders, it only requires 2 integral operations. When the invention is applied to the analog-to-digital converter, converting speed of the sigma-delta analog to digital conversion modulator of 3 orders is only half of that of the analog-to-digital converter, converting speed of the sigma-delta analog to digital conversion modulator of 2 orders.

In view of the problems from existing techniques, a feed forward sigma-delta analog to digital conversion modulator is provided by the present invention is disclosed. It integrates a feedback circuit, an adder circuit a quantization circuit. Architecture of the integrated circuit has an advantage of high stability and needs no active circuit. A control circuit uses a successive approximation register needs one comparator to achieve functions of a multi-bit quantization.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In order to settle the problems mentioned above, a feed forward sigma-delta analog to digital conversion modulator is provided in the present invention. The feed forward sigma-delta analog to digital conversion modulator includes: an input end capacitor switching circuit, for receiving an input timing control signal, an input voltage and a capacitor switching signal, and generating an integration input signal; a feed forward integrator, for receiving the integration input signal, a continuously progressive control signal and an input timing control signal, and generating an integration output signal; a multi-bit quantizer, for receiving an integration output signal and a quantization reference control signal, and generating a modulation output signal; a continuously progressive control circuit, for receiving the modulation output signal, and generating the quantization reference control signal, the continuously progressive control signal and a weighted average data signal; and a weighted average data circuit, for receiving the weighted average data signal, and generating the capacitor switching signal.

According to the present invention, the feed forward integrator comprises a plurality of integration circuits for processing integral operation. A procedure for connecting the plurality of integration circuit includes the steps of: serially connecting the plurality of integration circuits as a plurality of stages, wherein a first stage integrating circuit receives the integration input signal and generates a serially connected output signal to send to an input end of an second stage integrating circuit after integral operation, and then an output signal of a previous level integration circuit is sent to an input end of a next stage integrating circuit; and generating another output signal by each stage integrating circuit, respectively, wherein the output signals are linked to form the integration output signal.

According to the present invention, the first stage integrating circuit and every following stage integrating circuits except the last one includes: a first switching circuit group, wherein an input end of the first switching circuit group is coupled to an integration input signal and an output end thereof is coupled to an input end of an amplifier; the amplifier, wherein one input end of the amplifier is connected to the output end of the first switching circuit group, another input end thereof is connected to ground, and an output end thereof in coupled to both an input end of a second switching circuit group and an input end of a third switching circuit group; the second switching circuit group, wherein the input end of the second switching circuit group is coupled to the output end of the amplifier and an output end thereof is coupled to a second capacitor; the third switching circuit group, wherein an input end of the third switching circuit group is coupled to the output end of the amplifier and an output end thereof is coupled to a third capacitor; a first capacitor, coupled between the output end of the first switching circuit group and the input end of the amplifier; the second capacitor, coupled between the output end of the second switching circuit group and the integration output signal; and the third capacitor, coupled between the output end of the third switching circuit group and the serially connected output signal.

According to the present invention, the last stage integrating circuit includes: a first switching circuit group, wherein the input end of the first switching circuit group is coupled to an integration input signal and an output end thereof is coupled to an input end of an amplifier; the amplifier, wherein one input end of the amplifier is connected to an output end of the first switching circuit group, another input end thereof is connected to ground, and the output end thereof is coupled to an input end of a second switching circuit group; the second switching circuit group, wherein the input end of the second switching circuit group is coupled to the output end of the amplifier and an output end thereof is coupled to a second capacitor; a first capacitor, coupled between the output end of the first switching circuit group and the input end of the amplifier; and the second capacitor, coupled between the output end of the second switching circuit group and the integration output signal.

According to the present invention, the first stage integrating circuit and every following stage integrating circuits except the last one includes: a first switching circuit group, wherein an input end of the first switching circuit group is coupled to an integration input signal; a differential amplifier, wherein a positive input end of the differential amplifier is coupled to an output end of the first switching circuit group; a second switching circuit group, wherein an input end of the second switching circuit group is coupled to a negative output end of the differential amplifier; a third switching circuit group, wherein an input end of the third switching circuit group is coupled to the negative output end of the differential amplifier; a first capacitor, coupled between the positive input end and the negative output end of the differential amplifier; a second capacitor, coupled between the output end of the second switching circuit group and the integration output signal; a third capacitor, coupled between the output end of the third switching circuit group and the serially connected output signal; a negative-end first switching circuit group, wherein an input end of the negative-end first switching circuit group is coupled to a negative-end input signal; a negative-end second switching circuit group, wherein an input end of the negative-end second switching circuit group is coupled to a positive output end of the differential amplifier; a negative-end third switching circuit group, wherein an input end of the negative-end third switching circuit group is coupled to the positive output end of the differential amplifier; a negative-end first capacitor, coupled between a negative input end and the positive output end of the differential amplifier; a negative-end second capacitor, coupled between the output end of the negative-end second switching circuit group and a negative integration output signal; and a negative-end third capacitor, coupled between the output end of the negative-end third switching circuit group and a negative serially connected output signal.

According to the present invention, the first stage integrating circuit and every following stage integrating circuits except the last one includes: a first switching circuit group, wherein an input end of the first switching circuit group is coupled to an integration input signal; a differential amplifier, wherein a positive input end of the differential amplifier is coupled to an output end of the first switching circuit group; a second switching circuit group, wherein an input end of the second switching circuit group is coupled to a negative output end of the differential amplifier; a first capacitor, coupled between the positive input end and the negative output end of the differential amplifier; a second capacitor, coupled between an output end of the second switching circuit group and the integration output signal; a negative-end first switching circuit group, wherein an input end of the negative-end first switching circuit group is coupled to an negative-end input signal; a negative-end second switching circuit group, wherein an input end of the negative-end second switching circuit group is coupled to a positive output end of the differential amplifier; a negative-end first capacitor, is coupled between an negative input end an positive output end of the differential amplifier; and a negative-end second capacitor, coupled between an output end of the negative-end second switching circuit group and a negative integration output signal.

According to the present invention, the first switching circuit group includes: a first switch, coupled between the input end and the output end, for controlling switch status of signal control; and a second switch, coupled between the input end and the ground, for controlling switch status of signal control; the second switching circuit group includes: a first switch, coupled between the input end and the output end, and controlled by the first switch control signal; and a second switch, coupled between the output end and the ground, for controlling switch status of signal control.

According to the present invention, a control method of the switch circuits includes: a first operating timing, wherein a first timing signal is generated, two contacts on the left end and the right end of each first switching circuit group are not conducted at this moment, the contact on the left is connected to ground, the contact on the right stays suspension, two contacts on the left end and the right end of each second switching circuit group are conducted at the same time, and two contacts on the left end and the right end of each third switching circuit group are not conducted so that charging sampling is processed on the second capacitors of each stage integrating circuit at this timing; a continuously progressive control timing, wherein the continuously progressive control signal is generated, sequentially conduct the third switching circuit groups in each stage integrating circuit, control charged power in the third capacitors in each stage integrating circuit, and two contacts on the left end and the right end of each second switching circuit group and third switching circuit group are not contacted at this timing; and a second timing, wherein two contacts on the left end and the right end of each first switching circuit group are conducted, two contacts on the left end and the right end of each second switching circuit group are not conducted at the same time, the contact on the left stays suspension, the contact on the right is connected to ground, and two contacts on the left end and the right end of each third switching circuit group are not conducted.

According to the present invention, for the second capacitor or the negative-end second capacitor in each stage integrating circuit, their capacitance is able to adjust and the volume of the integration output signal is adjusted accordingly.

According to the present invention, the input end capacitor switching circuit includes a plurality of capacitor switching units connected to one another; the capacitor switching units receive the positive reference voltage, the negative reference voltage, the input voltage, the timing signal and the switching signal, and generate the output signal. The capacitor switching unit includes: a first switch, wherein one end is connected to a positive reference voltage; a second switch, connected between a negative reference voltage and the first switch; a third switch, wherein one end is connected to the first switch and the second switch and the other end is connected to ground; a fourth switch, wherein one end is connected to an input voltage; a fifth switch, wherein one end is connected to the fourth switch and the other end is connected to ground; a first switched-capacitor, wherein one end is connected to the first switch, the second switch and the third switch and the other end id connected to the output end; and a second switched-capacitor, wherein one end is connected to the second switch and the third switch and the other end is connected to the output end.

According to the present invention, a control method for the switches includes: a first operating timing, wherein a first timing signal is generated, directly conduct the fourth switch and sequentially conduct the first switches and the second switches of each capacitor switching unit according to a thermometer signal at the same time, and the third switch and the fifth switch are not conducted at this moment; and a second operating timing, wherein a second timing signal is generated, directly conduct the third switch and the fifth switch, the first switch, the second switch and the fourth switch are not conducted at this moment.

According to the present invention, the multi-bit quantizer comprises a comparator and uses a continuously progressive control circuit to generate a quantization reference control signal for adjusting a comparative level of the comparator so that the comparator generates a multi-bit modulation output signal.

DETAILED DESCRIPTION OF THE PREFERRED EMBODIMENTS

The present invention will now be described more specifically with reference to the following embodiments. It should be noticed that the embodiments of the present invention described below are used for illustrative purposes only; it doesn't mean that the present invention has been described in detail or is used to limit the disclosed aspect.

Figure 1:
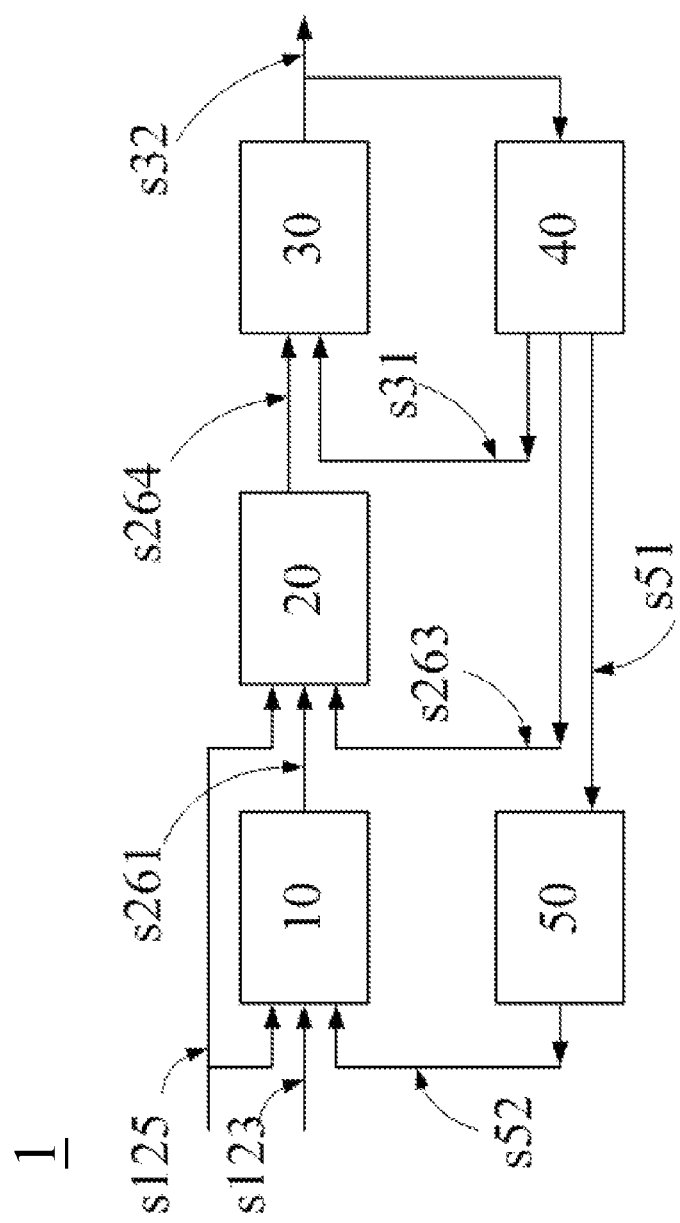
FIG. 1 shows an architecture of a feed forward sigma-delta analog to digital conversion modulator according to the present invention.
Figure 8:
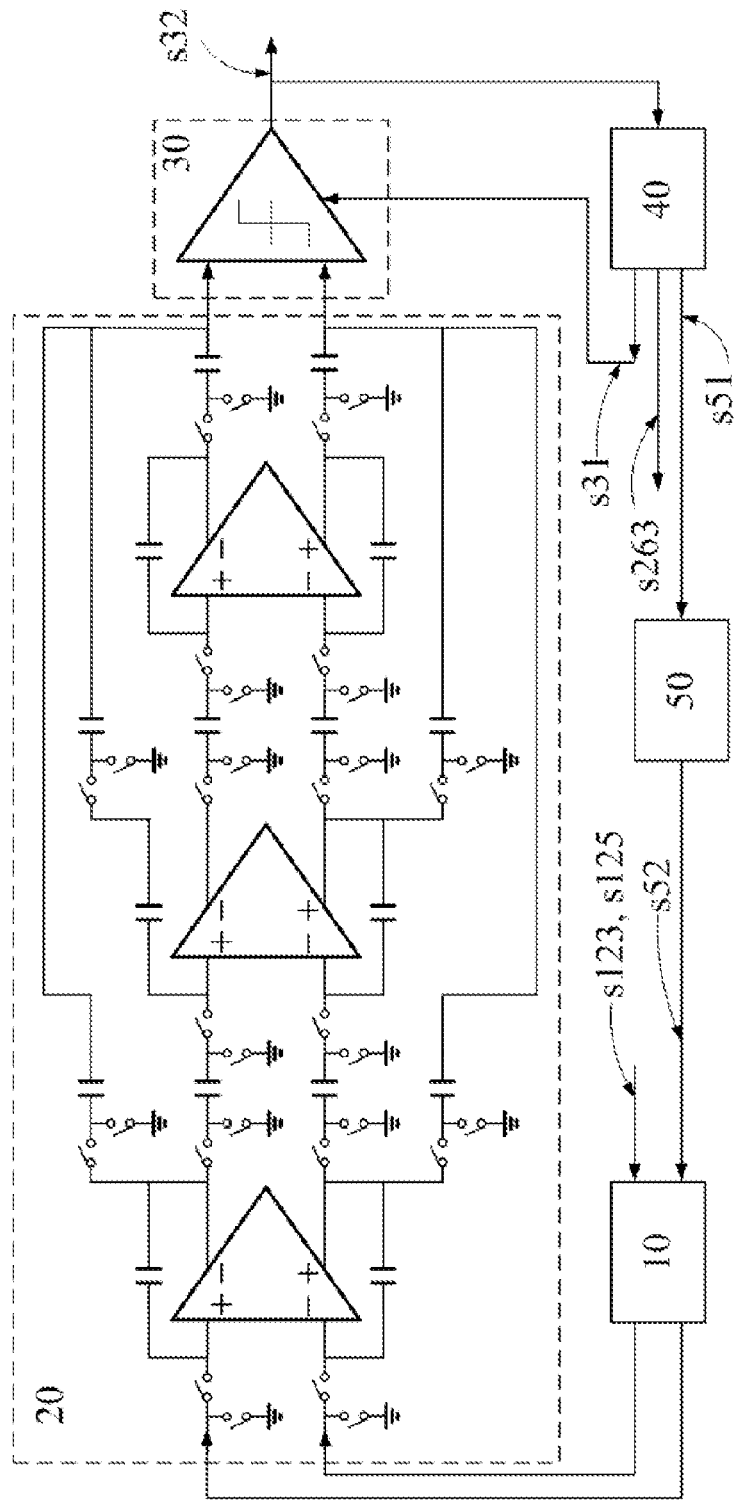
FIG. 8 is a circuit diagram of a differential circuit and a multi-bit quantizer of a feed forward integrator according to the present invention.

First, please refer to FIG. 1 with FIG. 8 at the same time. It shows an architecture of a feed forward sigma-delta analog to digital conversion modulator 1 of 3 order. The feed forward sigma-delta analog to digital conversion modulator 1 includes an input end capacitor switching circuit 10, a feed forward integrator 20, a multi-bit quantizer 30, a continuously progressive control circuit 40 and a weighted average data circuit 50. The input end capacitor switching circuit 10 receives an input timing control signal s125, an input voltage s123 and a capacitor switching signal s52, and generates an integration input signal s261. The feed forward integrator 20 receives the integration input signal s261, a continuously progressive control signal s263 and an input timing control signal s125, and generates an integration output signal s264. The multi-bit quantizer 30 receives the integration output signal s264 and a quantization reference control signal s31, and generates a modulation output signal s32. The continuously progressive control circuit 40 receives the modulation output signal s32, and generates quantization reference control signal s31, the continuously progressive control signal s263 and a weighted average data signal s51. The weighted average data circuit 50 receives the weighted average data signal s51 and generates the capacitor switching signal s52.

Figure 2:
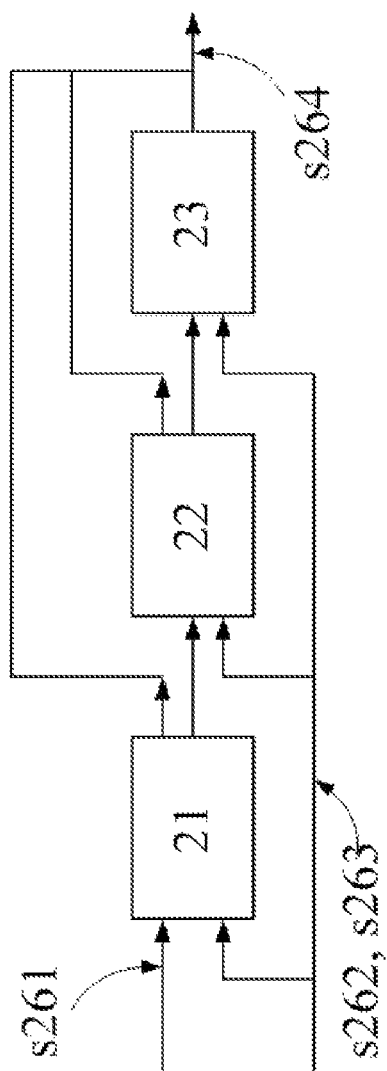
FIG. 2 shows an architecture of a feed forward integrator according to the present invention.

Next, please refer to FIG. 2. It shows an architecture of a feed forward integrator 20. The feed forward integrator 20 is formed by serially connecting a number of integration circuits for processing integral operation and controls outputs of every stage integrating circuits by a control signal. For the present invention, the feed forward integrator 20 includes a first stage integrating circuit 21, a second stage integrating circuit 22 and a third stage integrating circuit 23. The first stage integrating circuit 21 receives the integration input signal s261 and an integration timing control signal s262. After integral operation, two output signals are generated and sent to the next stage integrating circuit and a last output end, respectively. The following stage integrating circuits except the last one receives the output signal and the control signal from a stage integrating circuit in previous level. After integral operation, two output signals are generated and sent to the next stage integrating circuit and the last output end, respectively. The last stage integrating circuit receives the output signal and the control signal from a stage integrating circuit in previous level. After integral operation, one output signal is generated and directly sent to the last output point.

Figure 3:
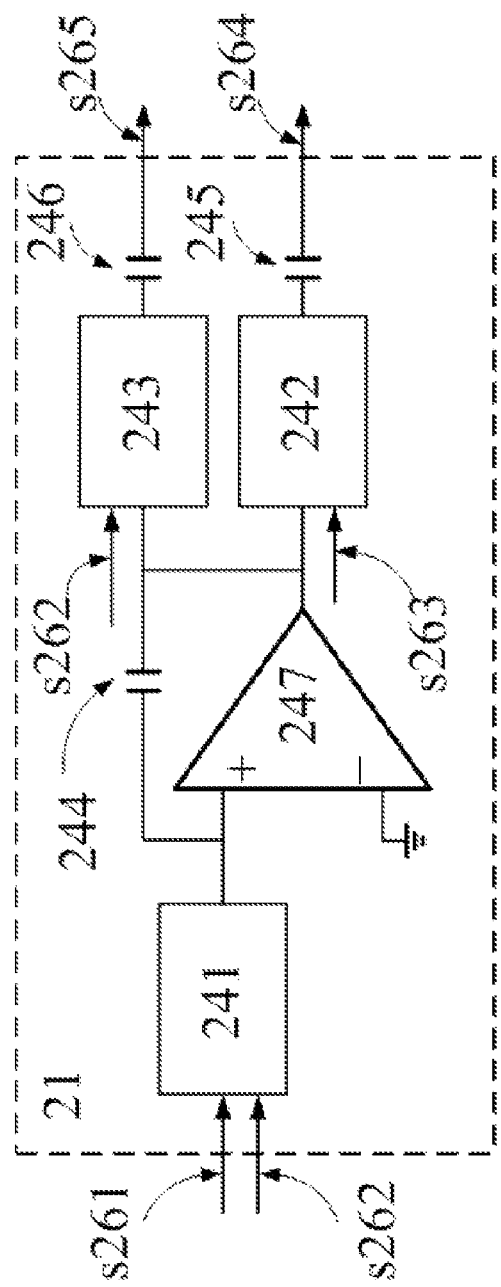
FIG. 3 shows an architecture of a stage integrating circuit of a feed forward integrator according to the present invention.

Please refer to FIG. 3. It shows an architecture of a single stage integrating circuit of the feed forward integrator 20. Take the first stage integrating circuit 21 in the feed forward integrator 20 as an example. The first stage integrating circuit 21 includes an amplifier 247, 3 capacitors (first capacitor 244, second capacitor 245 and third capacitor 246) and 3 switching circuit groups (first switching circuit group 241, second switching circuit group 242 and third switching circuit group 243). An input end of the first switching circuit group 241 is coupled to the integration input signal s261. Its output end is coupled to one input end of the amplifier 247. The other input end of the amplifier 247 connects to ground. Its output end is coupled to both an input end of the second switching circuit group 242 and an input end of the third switching circuit group 243 at the same time. The first capacitor 244 is coupled between the output end of the first switching circuit group 241 and the input end of the amplifier 247. The second capacitor 245 is coupled between the output end of the second switching circuit group 242 and the integration output signal s264. The third capacitor 246 is coupled between the output end of the third switching circuit group 243 and a serially connected output signal s265. The following stage integrating circuit except the last one has the same architecture as that of the first stage integrating circuit 21. Difference is the input end of the first stage integrating circuit 21 receives the integration input signal s261, while the input end of the following stage integrating circuit except the last one receives the serially connected output signal s265 from the previous level.

Figure 4:
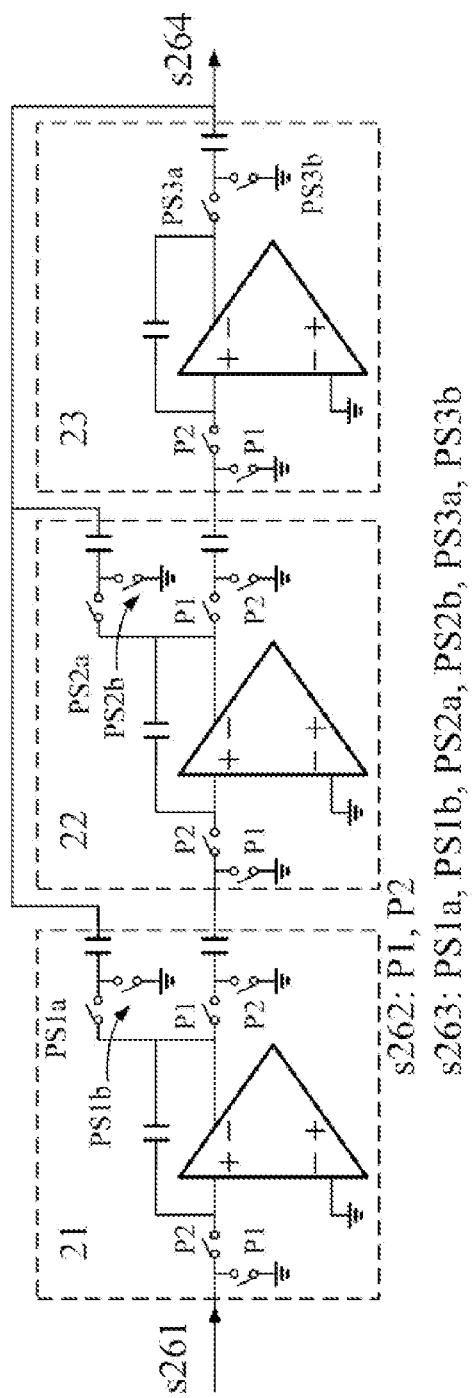
FIG. 4 is a diagram of a circuit of a feed forward integrator according to the present invention.

Next, please refer to FIG. 3 and FIG. 4 at the same time. It shows a circuit diagram of the feed forward integrator 20 in the present invention. The last stage integrating circuit 23 of the feed forward integrator 20 includes an amplifier 247, 2 capacitors and 2 switching circuit groups. The input end of the first switching circuit group 241 is coupled to the integration input signal s261 and the integration timing control signal s262. Its output end is coupled to the input end of the amplifier 247. The other input end of the amplifier 247 connects to ground. The output end is coupled to the input end of the second switching circuit group 242. The first capacitor 244 is coupled between the output end of the first switching circuit group 241 and the input end of the amplifier 247. The second capacitor 245 is coupled between the output end of the second switching circuit group 242 and the integration output signal s264.

Figure 5:
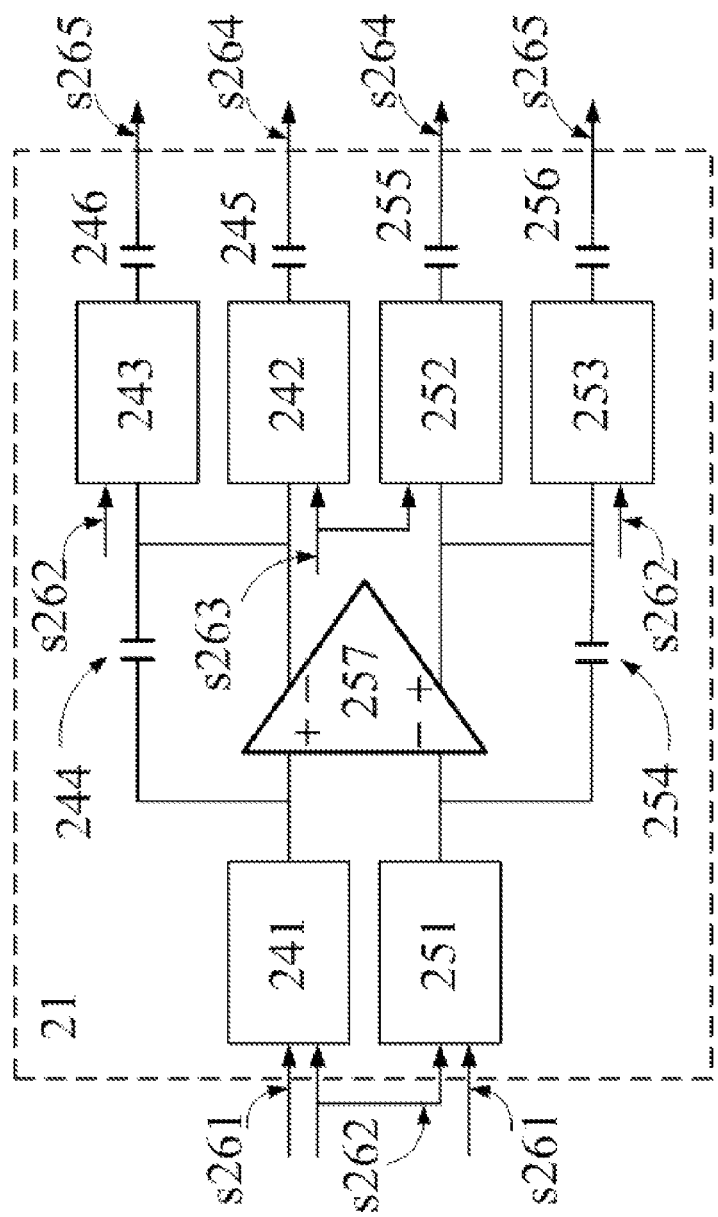
FIG. 5 shows an architecture of a single level integration differential circuit of a feed forward integrator according to the present invention.

Please refer to FIG. 5. It shows an architecture of a single level integration differential circuit of the feed forward integrator 20 in the present invention. According to the present invention, the first stage integrating circuit 21 of the feed forward integrator 20 may use the differential architecture to implement. It has an effect to increase SNR for signals. The architecture includes a differential amplifier 257, 6 capacitors (first capacitor 244, second capacitor 245, third capacitor 246, negative-end first capacitor 254, negative-end second capacitor 255 and negative-end third capacitor 256) and 6 switching circuit groups (first switching circuit group 241, second switching circuit group 242, third switching circuit group 243, negative-end first switching circuit group 251, negative-end second switching circuit group 252 and negative-end third switching circuit group 253). The input end of the first switching circuit group 241 is coupled to the integration input signal s261 and the integration timing control signal s262. Its output end is coupled to a positive input end of the differential amplifier 257. An negative output end of the differential amplifier 257 is coupled to the second switching circuit group 242 and the input end of the third switching circuit group 243 at the same time. The first capacitor 244 is coupled between the output end of the first switching circuit group 241 and the positive input end of the differential amplifier 257. The second capacitor 245 is coupled between the output end of the second switching circuit group 242 and the integration output signal s264. The third capacitor 246 is coupled between the output end of the third switching circuit group 243 and the serially connected output signal s265. An input end of the negative-end first switching circuit group 251 is coupled to the negative-end input signal. Its output end is coupled to a negative input end of the differential amplifier 257. A positive output end of the differential amplifier 257 is coupled to an input end of the negative-end second switching circuit group 252 and an input end of the negative-end third switching circuit group 253. The negative-end first capacitor 254 is coupled between the output end of the negative-end first switching circuit group 251 and the negative input end of the differential amplifier 257. The negative-end second capacitor 255 is coupled between an output end of the negative-end second switching circuit group 252 and the negative-end integration output signal s264. The negative-end third capacitor 256 is coupled between an output end of the negative-end third switching circuit group 253 and the negative-end serially connected output signal s265. The following stage integrating circuits except the last one has the same architecture as that of the first stage integrating circuit 21. Difference is the input end of the first stage integrating circuit 21 receives the input signal and the negative-end input signal, while input ends of the following stage integrating circuits except the last one receive the positive serially connected output signal s265 and negative-end serially connected output signal s265 from the previous level.

The last stage integrating circuit 23 of the feed forward integrator 20 in the present invention may use a differential architecture to implement. Its architecture includes a differential amplifier 257, 4 capacitors (first capacitor 244, second capacitor 245, negative-end first capacitor 254 and negative-end second capacitor 255) and 4 switching circuit groups (first switching circuit group 241, second switching circuit group 242, negative-end first switching circuit group 251 and negative-end second switching circuit group 252). The input end of the first switching circuit group 241 is coupled the input signal. Its output end is coupled the positive input end of the differential amplifier 257. The negative output end of the differential amplifier 257 is coupled to the input end of the second switching circuit group 242. The first capacitor 244 is coupled between the output end of the first switching circuit group 241 and the positive input end of the differential amplifier 257. The second capacitor 245 is coupled between the output end of the second switching circuit group 242 and the integration output signal s264. The input end of the negative-end first switching circuit group 251 is coupled to the negative-end input signal. Its output end is coupled to the negative input end of the differential amplifier 257. The positive output end of the differential amplifier 257 is coupled to the input end of the negative-end second switching circuit group 252. The negative-end first capacitor 254 is coupled between the output end of the negative-end first switching circuit group 251 and the negative input end of the differential amplifier 257. The negative-end second capacitor 255 is coupled between the output end of the negative-end second switching circuit group 252 and the negative-end integration output signal s264.

Figure 9:
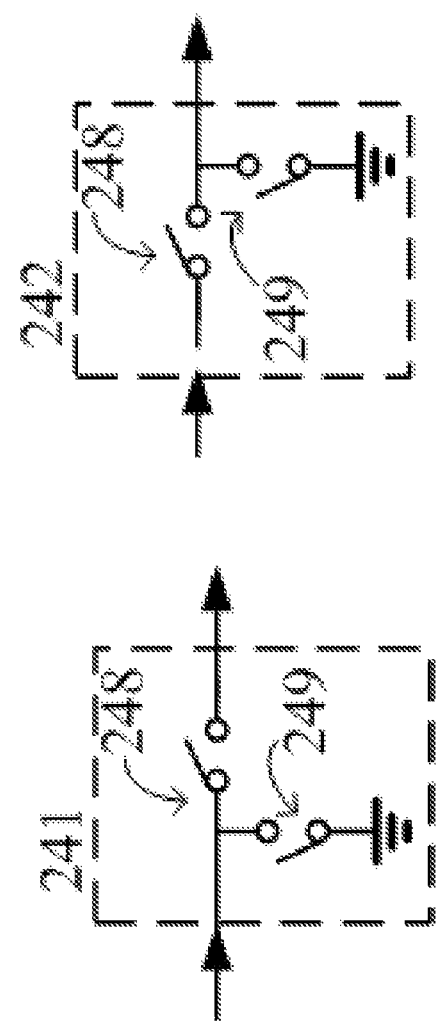
FIG. 9 shows structure of a first switching circuit group and a second switching circuit group in each stage integrating circuit of a feed forward integrator according to the present invention.

Next, please refer to FIG. 9. It shows structures of the first switching circuit group 241 and the second switching circuit group 242 in each stage integrating circuit in the present invention. As it shown, the first switching circuit group 241 includes 2 switches (first switch 248 and second switch 249). The first switch 248 is coupled between the input end and the output end and controls switch status of signal control. The second switch 249 is coupled between the input end and the ground and controls switch status of signal control. The second switching circuit group 242 also has 2 switches (first switch 248 and second switch 249). The first switch 248 is coupled between the input end and the output end and controls switch status of signal control. The second switch 249 is coupled between the output end and the ground and controls switch status of signal control.

For the second capacitor 245 or the negative-end second capacitor 255 in each stage integrating circuit of the feed forward integrator 20 in the present invention, their capacitance is able to adjust and the volume of the integration output signal 264 is adjusted accordingly.

A control method of the switch circuits of the feed forward integrator 20 in the present invention has three operating timings. In a first operating timing, a first timing signal is generated. Two contacts on the left end and the right end of each first switching circuit group 241 are not conducted at this moment. The contact on the left is connected to ground and the contact on the right stays suspension. Two contacts on the left end and the right end of each second switching circuit group 242 are conducted at the same time.

Two contacts on the left end and the right end of each third switching circuit group 243 are not conducted so that charging sampling is processed on the second capacitors 245 of each stage integrating circuit at this timing. Next, come to a continuously progressive control timing. The continuously progressive control signal 263 is generated. Sequentially conduct the third switching circuit groups 243 in each stage integrating circuit. Control charged power in the third capacitors 246 in each stage integrating circuit. Two contacts on the left end and the right end of each second switching circuit group 242 and third switching circuit group 243 are not contacted at this timing. Last, come to a second timing. Two contacts on the left end and the right end of each first switching circuit group 241 are conducted. Two contacts on the left end and the right end of each second switching circuit group 242 are not conducted at the same time. The contact on the left stays suspension while the contact on the right is connected to ground. Two contacts on the left end and the right end of each third switching circuit group 243 are not conducted. Since the integration circuit has a feature of feed forward path, directly connecting by capacitors, utilize said timing operating control capacitor to charge and discharge sigma-delta integral operation can be achieved. Adder circuit in the output end can be saved.

Figure 6:
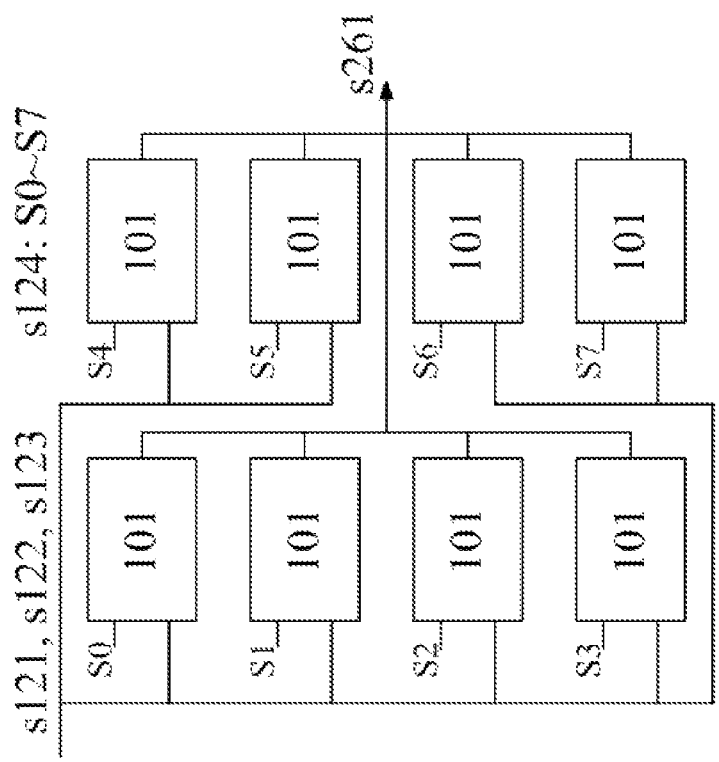
FIG. 6 shows an architecture of an input end capacitor switching circuit according to the present invention.

Please refer to FIG. 6. It shows an architecture of the input end capacitor switching circuit 10 in the present invention. The input end capacitor switching circuit 10 of the feed forward sigma-delta analog to digital conversion modulator 1 in the present invention includes a number of input capacitor switching units 101 connected to one another. The input capacitor switching units 101 receive the positive reference voltage s121, the negative reference voltage s122, the input voltage s123, the timing signal and the switching signal, and generate the output signal.

Figure 7:
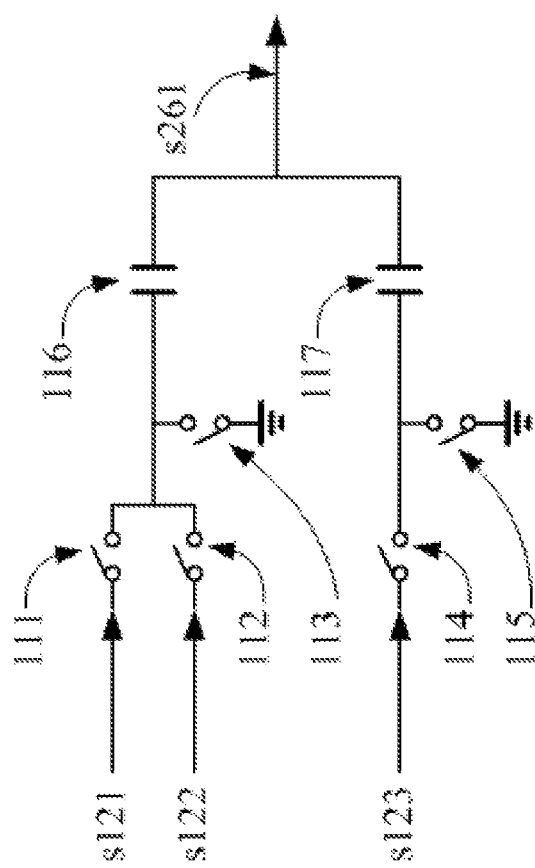
FIG. 7 shows an architecture of an input capacitor switching unit according to the present invention.

Please refer to FIG. 7. It shows an architecture of the input capacitor switching unit 101. The input capacitor switching unit 101 in the present invention includes 5 switches (first switch 111, second switch 112, third switch 113, fourth switch 114 and fifth switch 115) and 2 capacitors (first switched-capacitor 116 and second switched-capacitor 117). One end of the first switch 111 is connected to the positive reference voltage s121. The other end is connected to the second switch 112, the third switch 113 and the first switched-capacitor 116. The other end of the second switch 112 is connected to the negative reference voltage s122. The other end of the third switch 113 is connected to ground. The other end of the first switched-capacitor 116 is connected to the second switched-capacitor 117. The other end of the second switched-capacitor 117 is connected to the fourth switch 114v and the fifth switch 115. The other end of the fourth switch 114 is connected to the input voltage s123. The other end of the fifth switch 115 is connected to ground.

A control method for the switches includes two operating timing. In a first operating timing, a first timing signal is generated. Directly conduct the fourth switch 114 and sequentially conduct the first switches 111 and the second switches 112 of each capacitor switching unit 101 according to a thermometer signal s124 at the same time. The third switch 113 and the fifth switch 115 are not conducted at this moment. In a second operating timing, a second timing signal is generated. Directly conduct the third switch 113 and the fifth switch 115. The first switch 111, the second switch 112 and the fourth switch 114 are not conducted at the moment. The effect is sequentially switching the capacitors in the capacitor switching units to generate the input signal of the feed forward integrator 20 according to the output signal of the weighted average data circuit 50. It is to reduce the noise caused by mismatching of capacitances.

Last, please refer to FIG. 8. It shows a circuit diagram of the differential circuit and the multi-bit quantizer 30 of the feed forward integrator 20 in the present invention. The multi-bit quantizer 30 in the present invention can be implemented by a comparator and uses a continuously progressive control circuit to generate a quantization reference control signal s31 for adjusting a comparative level of the comparator so that the comparator generates a multi-bit modulation output signal s32.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A feed forward sigma-delta analog to digital conversion modulator, comprising:
   an input end capacitor switching circuit, for receiving an input timing control signal, an input voltage and a capacitor switching signal, and generating an integration input signal;
   a feed forward integrator, for receiving the integration input signal, a continuously progressive control signal and an input timing control signal, and generating an integration output signal;
   a multi-bit quantizer, for receiving an integration output signal and a quantization reference control signal, and generating a modulation output signal;
   a continuously progressive control circuit, for receiving the modulation output signal, and generating the quantization reference control signal, the continuously progressive control signal and a weighted average data signal; and
   a weighted average data circuit, for receiving the weighted average data signal, and generating the capacitor switching signal.

2. The feed forward sigma-delta analog to digital conversion modulator according to claim 1, wherein the feed forward integrator comprises a plurality of integration circuits for processing integral operation; a procedure for connecting the plurality of integration circuit comprises the steps of:
   serially connecting the plurality of integration circuits as a plurality of stages, wherein a first stage integrating circuit receives the integration input signal and generates a serially connected output signal to send to an input end of an second stage integrating circuit after integral operation, and then an output signal of a previous level integration circuit is sent to an input end of a next stage integrating circuit; and
   generating another output signal by each stage integrating circuit, respectively, wherein the output signals are linked to form the integration output signal.

3. The feed forward sigma-delta analog to digital conversion modulator according to claim 2, wherein the first stage integrating circuit and every following stage integrating circuits except the last one comprises:
   a first switching circuit group, wherein an input end of the first switching circuit group is coupled to an integration input signal and an output end thereof is coupled to an input end of an amplifier;

the amplifier, wherein one input end of the amplifier is connected to the output end of the first switching circuit group, another input end thereof is connected to ground, and a output end thereof in coupled to both an input end of a second switching circuit group and an input end of a third switching circuit group;

the second switching circuit group, wherein the input end of the second switching circuit group is coupled to the output end of the amplifier and an output end thereof is coupled to a second capacitor;

the third switching circuit group, wherein an input end of the third switching circuit group is coupled to the output end of the amplifier and an output end thereof is coupled to a third capacitor;

a first capacitor, coupled between the output end of the first switching circuit group and the input end of the amplifier;

the second capacitor, coupled between the output end of the second switching circuit group and the integration output signal; and the third capacitor, coupled between the output end of the third switching circuit group and the serially connected output signal.

4. The feed forward sigma-delta analog to digital conversion modulator according to claim 3, wherein the first switching circuit group comprises:
 a first switch, coupled between the input end and the output end, for controlling switch status of signal control; and
 a second switch, coupled between the input end and the ground, for controlling switch status of signal control;
the second switching circuit group comprises:
 a first switch, coupled between the input end and the output end, and controlled by the first switch control signal; and
 a second switch, coupled between the output end and the ground, for controlling switch status of signal control.

5. The feed forward sigma-delta analog to digital conversion modulator according to claim 3, wherein for the second capacitor or the negative-end second capacitor in each stage integrating circuit, their capacitance is able to adjust and the volume of the integration output signal is adjusted accordingly.

6. The feed forward sigma-delta analog to digital conversion modulator according to claim 3, wherein the multi-bit quantizer comprises a comparator and uses a continuously progressive control circuit to generate a quantization reference control signal for adjusting a comparative level of the comparator so that the comparator generates a multi-bit modulation output signal.

7. The feed forward sigma-delta analog to digital conversion modulator according to claim 3, wherein a control method of the switch circuits comprises:
 a first operating timing, wherein a first timing signal is generated, two contacts on the left end and the right end of each first switching circuit group are not conducted at this moment, the contact on the left is connected to ground, the contact on the right stays suspension, two contacts on the left end and the right end of each second switching circuit group are conducted at the same time, and two contacts on the left end and the right end of each third switching circuit group are not conducted so that charging sampling is processed on the second capacitors of each stage integrating circuit at this timing;
 a continuously progressive control timing, wherein the continuously progressive control signal is generated, sequentially conduct the third switching circuit groups in each stage integrating circuit, control charged power in the third capacitors in each stage integrating circuit, and two contacts on the left end and the right end of each second switching circuit group and third switching circuit group are not contacted at this timing; and
 a second timing, wherein two contacts on the left end and the right end of each first switching circuit group are conducted, two contacts on the left end and the right end of each second switching circuit group are not conducted at the same time, the contact on the left stays suspension, the contact on the right is connected to ground, and two contacts on the left end and the right end of each third switching circuit group are not conducted.

8. The feed forward sigma-delta analog to digital conversion modulator according to claim 2, wherein the last stage integrating circuit comprises:
 a first switching circuit group, wherein the input end of the first switching circuit group is coupled to an integration input signal and an output end thereof is coupled to an input end of an amplifier;
 the amplifier, wherein one input end of the amplifier is connected to an output end of the first switching circuit group, another input end thereof is connected to ground, and the output end thereof is coupled to an input end of a second switching circuit group;
 the second switching circuit group, wherein the input end of the second switching circuit group is coupled to the output end of the amplifier and an output end thereof is coupled to a second capacitor;
 a first capacitor, coupled between the output end of the first switching circuit group and the input end of the amplifier; and
 the second capacitor, coupled between the output end of the second switching circuit group and the integration output signal.

9. The feed forward sigma-delta analog to digital conversion modulator according to claim 8, wherein the first switching circuit group comprises:
 a first switch, coupled between the input end and the output end, for controlling switch status of signal control; and
 a second switch, coupled between the input end and the ground, for controlling switch status of signal control;
the second switching circuit group comprises:
 a first switch, coupled between the input end and the output end, and controlled by the first switch control signal; and
 a second switch, coupled between the output end and the ground, for controlling switch status of signal control.

10. The feed forward sigma-delta analog to digital conversion modulator according to claim 8, wherein a control method of the switch circuits comprises:
 a first operating timing, wherein a first timing signal is generated, two contacts on the left end and the right end of each first switching circuit group are not conducted at this moment, the contact on the left is connected to ground, the contact on the right stays suspension, two contacts on the left end and the right end of each second switching circuit group are conducted at the same time, and two contacts on the left end and the right end of each third switching circuit group are not conducted so that charging sampling is processed on the second capacitors of each stage integrating circuit at this timing;

a continuously progressive control timing, wherein the continuously progressive control signal is generated, sequentially conduct the third switching circuit groups in each stage integrating circuit, control charged power in the third capacitors in each stage integrating circuit, and two contacts on the left end and the right end of each second switching circuit group and third switching circuit group are not contacted at this timing; and a second timing, wherein two contacts on the left end and the right end of each first switching circuit group are conducted, two contacts on the left end and the right end of each second switching circuit group are not conducted at the same time, the contact on the left stays suspension, the contact on the right is connected to ground, and two contacts on the left end and the right end of each third switching circuit group are not conducted.

11. The feed forward sigma-delta analog to digital conversion modulator according to claim 8, wherein for the second capacitor or the negative-end second capacitor in each stage integrating circuit, their capacitance is able to adjust and the volume of the integration output signal is adjusted accordingly.

12. The feed forward sigma-delta analog to digital conversion modulator according to claim 8, wherein the multi-bit quantizer comprises a comparator and uses a continuously progressive control circuit to generate a quantization reference control signal for adjusting a comparative level of the comparator so that the comparator generates a multi-bit modulation output signal.

13. The feed forward sigma-delta analog to digital conversion modulator according to claim 2, wherein the first stage integrating circuit and every following stage integrating circuits except the last one comprises:
  a first switching circuit group, wherein an input end of the first switching circuit group is coupled to an integration input signal;
  a differential amplifier, wherein a positive input end of the differential amplifier is coupled to an output end of the first switching circuit group;
  a second switching circuit group, wherein an input end of the second switching circuit group is coupled to a negative output end of the differential amplifier;
  a third switching circuit group, wherein an input end of the third switching circuit group is coupled to the negative output end of the differential amplifier;
  a first capacitor, coupled between the positive input end and the negative output end of the differential amplifier;
  a second capacitor, coupled between the output end of the second switching circuit group and the integration output signal;
  a third capacitor, coupled between the output end of the third switching circuit group and the serially connected output signal;
  a negative-end first switching circuit group, wherein an input end of the negative-end first switching circuit group is coupled to a negative-end input signal;
  a negative-end second switching circuit group, wherein an input end of the negative-end second switching circuit group is coupled to a positive output end of the differential amplifier;
  a negative-end third switching circuit group, wherein an input end of the negative-end third switching circuit group is coupled to the positive output end of the differential amplifier;
  a negative-end first capacitor, coupled between a negative input end and the positive output end of the differential amplifier;
  a negative-end second capacitor, coupled between the output end of the negative-end second switching circuit group and a negative integration output signal; and
  a negative-end third capacitor, coupled between the output end of the negative-end third switching circuit group and a negative serially connected output signal.

14. The feed forward sigma-delta analog to digital conversion modulator according to claim 13, wherein the first switching circuit group comprises:
  a first switch, coupled between the input end and the output end, for controlling switch status of signal control; and
  a second switch, coupled between the input end and the ground, for controlling switch status of signal control;
  the second switching circuit group comprises:
  a first switch, coupled between the input end and the output end, and controlled by the first switch control signal; and
  a second switch, coupled between the output end and the ground, for controlling switch status of signal control.

15. The feed forward sigma-delta analog to digital conversion modulator according to claim 13, wherein a control method of the switch circuits comprises:
  a first operating timing, wherein a first timing signal is generated, two contacts on the left end and the right end of each first switching circuit group are not conducted at this moment, the contact on the left is connected to ground, the contact on the right stays suspension, two contacts on the left end and the right end of each second switching circuit group are conducted at the same time, and two contacts on the left end and the right end of each third switching circuit group are not conducted so that charging sampling is processed on the second capacitors of each stage integrating circuit at this timing;
  a continuously progressive control timing, wherein the continuously progressive control signal is generated, sequentially conduct the third switching circuit groups in each stage integrating circuit, control charged power in the third capacitors in each stage integrating circuit, and two contacts on the left end and the right end of each second switching circuit group and third switching circuit group are not contacted at this timing; and
  a second timing, wherein two contacts on the left end and the right end of each first switching circuit group are conducted, two contacts on the left end and the right end of each second switching circuit group are not conducted at the same time, the contact on the left stays suspension, the contact on the right is connected to ground, and two contacts on the left end and the right end of each third switching circuit group are not conducted.

16. The feed forward sigma-delta analog to digital conversion modulator according to claim 13, wherein for the second capacitor or the negative-end second capacitor in each stage integrating circuit, their capacitance is able to adjust and the volume of the integration output signal is adjusted accordingly.

17. The feed forward sigma-delta analog to digital conversion modulator according to claim 13, wherein the multi-bit quantizer comprises a comparator and uses a continuously progressive control circuit to generate a quantization reference control signal for adjusting a comparative level of the comparator so that the comparator generates a multi-bit modulation output signal.

18. The feed forward sigma-delta analog to digital conversion modulator according to claim 2, wherein the first stage integrating circuit and every following stage integrating circuits except the last one comprises:
a first switching circuit group, wherein an input end of the first switching circuit group is coupled to an integration input signal;
a differential amplifier, wherein a positive input end of the differential amplifier is coupled to an output end of the first switching circuit group;
a second switching circuit group, wherein an input end of the second switching circuit group is coupled a negative output end of the differential amplifier;
a first capacitor, coupled between the positive input end and the negative output end of the differential amplifier;
a second capacitor, coupled between an output end of the second switching circuit group and the integration output signal;
a negative-end first switching circuit group, wherein an input end of the negative-end first switching circuit group is coupled to an negative-end input signal;
a negative-end second switching circuit group, wherein an input end of the negative-end second switching circuit group is coupled to a positive output end of the differential amplifier;
a negative-end first capacitor, is coupled between an negative input end an positive output end of the differential amplifier; and
a negative-end second capacitor, coupled between an output end of the negative-end second switching circuit group and a negative integration output signal.

19. The feed forward sigma-delta analog to digital conversion modulator according to claim 18, wherein the first switching circuit group comprises:
a first switch, coupled between the input end and the output end, for controlling switch status of signal control; and
a second switch, coupled between the input end and the ground, for controlling switch status of signal control;
the second switching circuit group comprises:
a first switch, coupled between the input end and the output end, and controlled by the first switch control signal; and
a second switch, coupled between the output end and the ground, for controlling switch status of signal control.

20. The feed forward sigma-delta analog to digital conversion modulator according to claim 18, wherein for the second capacitor or the negative-end second capacitor in each stage integrating circuit, their capacitance is able to adjust and the volume of the integration output signal is adjusted accordingly.

21. The feed forward sigma-delta analog to digital conversion modulator according to claim 18, wherein the multi-bit quantizer comprises a comparator and uses a continuously progressive control circuit to generate a quantization reference control signal for adjusting a comparative level of the comparator so that the comparator generates a multi-bit modulation output signal.

22. The feed forward sigma-delta analog to digital conversion modulator according to claim 2, wherein the multi-bit quantizer comprises a comparator and uses a continuously progressive control circuit to generate a quantization reference control signal for adjusting a comparative level of the comparator so that the comparator generates a multi-bit modulation output signal.

23. The feed forward sigma-delta analog to digital conversion modulator according to claim 18, wherein a control method of the switch circuits comprises:
a first operating timing, wherein a first timing signal is generated, two contacts on the left end and the right end of each first switching circuit group are not conducted at this moment, the contact on the left is connected to ground, the contact on the right stays suspension, two contacts on the left end and the right end of each second switching circuit group are conducted at the same time, and two contacts on the left end and the right end of each third switching circuit group are not conducted so that charging sampling is processed on the second capacitors of each stage integrating circuit at this timing;
a continuously progressive control timing, wherein the continuously progressive control signal is generated, sequentially conduct the third switching circuit groups in each stage integrating circuit, control charged power in the third capacitors in each stage integrating circuit, and two contacts on the left end and the right end of each second switching circuit group and third switching circuit group are not contacted at this timing; and
a second timing, wherein two contacts on the left end and the right end of each first switching circuit group are conducted, two contacts on the left end and the right end of each second switching circuit group are not conducted at the same time, the contact on the left stays suspension, the contact on the right is connected to ground, and two contacts on the left end and the right end of each third switching circuit group are not conducted.

24. The feed forward sigma-delta analog to digital conversion modulator according to claim 1, wherein the input end capacitor switching circuit comprises a plurality of capacitor switching units connected to one another;
the capacitor switching units receive the positive reference voltage, the negative reference voltage, the input voltage, the timing signal and the switching signal, and generate the output signal; wherein the capacitor switching unit comprises:
a first switch, wherein one end is connected to a positive reference voltage;
a second switch, connected between a negative reference voltage and the first switch;
a third switch, wherein one end is connected to the first switch and the second switch and the other end is connected to ground;
a fourth switch, wherein one end is connected to an input voltage;
a fifth switch, wherein one end is connected to the fourth switch and the other end is connected to ground;
a first switched-capacitor, wherein one end is connected to the first switch, the second switch and the third switch and the other end id connected to the output end; and
a second switched-capacitor, wherein one end is connected to the second switch and the third switch and the other end is connected to the output end.

25. The feed forward sigma-delta analog to digital conversion modulator according to claim 24, wherein a control method for the switches comprises:
a first operating timing, wherein a first timing signal is generated, directly conduct the fourth switch and sequentially conduct the first switches and the second switches of each capacitor switching unit according to a thermometer signal at the same time, and the third switch and the fifth switch are not conducted at this moment; and a second operating timing, wherein a second timing signal is generated, directly conduct the third switch and the fifth switch, the first switch, the second switch and the fourth switch are not conducted at this moment.

26. The feed forward sigma-delta analog to digital conversion modulator according to claim 1, wherein the multi-bit quantizer comprises a comparator and uses a continuously progressive control circuit to generate a quantization reference control signal for adjusting a comparative level of the comparator so that the comparator generates a multi-bit modulation output signal.

\* \* \* \* \*